(12) United States Patent
Harper et al.

(10) Patent No.: US 8,377,746 B2
(45) Date of Patent: Feb. 19, 2013

(54) INTEGRATED CIRCUIT STACKED PACKAGE PRECURSORS AND STACKED PACKAGED DEVICES AND SYSTEMS THEREFROM

(75) Inventors: Peter R. Harper, Lucas, TX (US); Kenneth Maggio, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/244,364

(22) Filed: Sep. 24, 2011

(65) Prior Publication Data

US 2012/0015478 A1    Jan. 19, 2012

Related U.S. Application Data

(62) Division of application No. 12/388,976, filed on Feb. 19, 2009, now Pat. No. 8,049,320.

(60) Provisional application No. 61/029,812, filed on Feb. 19, 2008, provisional application No. 61/029,814, filed on Feb. 19, 2008, provisional application No. 61/141,735, filed on Dec. 31, 2008.

(51) Int. Cl.
*H01L 21/44* (2006.01)
*H01L 21/48* (2006.01)

(52) U.S. Cl. .. 438/109; 438/107; 438/127; 257/E23.169

(58) Field of Classification Search .................. 438/107, 438/109, 127; 257/E23.169
See application file for complete search history.

(56) References Cited

U.S. PATENT DOCUMENTS

| | | | |
|---|---|---|---|
| 6,051,878 A * | 4/2000 | Akram et al. | 257/686 |
| 6,982,488 B2 | 1/2006 | Shin et al. | |
| 7,102,892 B2 * | 9/2006 | Kledzik et al. | 361/770 |
| 7,494,847 B2 * | 2/2009 | Karnezos et al. | 438/109 |
| 2005/0121764 A1 | 6/2005 | Mallik et al. | |
| 2006/0035409 A1 | 2/2006 | Suh et al. | |
| 2006/0108676 A1 | 5/2006 | Punzalan et al. | |
| 2006/0175696 A1 | 8/2006 | Kim | |
| 2008/0251906 A1* | 10/2008 | Eaton et al. | 257/686 |

OTHER PUBLICATIONS

"SIP: System in Package,"[online] Carsem, [retrieved on Feb. 17, 2009], retrieved from the Internet: <http://www.carsem.com/services/Drugs&Data/ds_sip.pdf>.

* cited by examiner

*Primary Examiner* — Nitin Parekh
(74) *Attorney, Agent, or Firm* — Steven A. Shaw; W. James Brady; Frederick J. Telecky, Jr.

(57) ABSTRACT

A package-on-package (POP) package precursor and packaged devices and systems therefrom includes an electronic substrate including electrically conductive layers and a top surface. A first portion of the top surface has an IC die attached thereon. A second portion of the top surface has a plurality of first attach pads on opposing sides of the IC die for electrically coupling to a first electronic device on top of the IC die. At least a third portion of the top surface is positioned laterally with respect to the first and second portion. The third portion includes a plurality of second attach pads for electrically coupling to at least a second electronic device. At least one of the electrically conductive layers includes a coupling trace that couples at least one of the plurality of second attach pads to the IC die and/or one or more of the plurality of first attach pads.

2 Claims, 9 Drawing Sheets

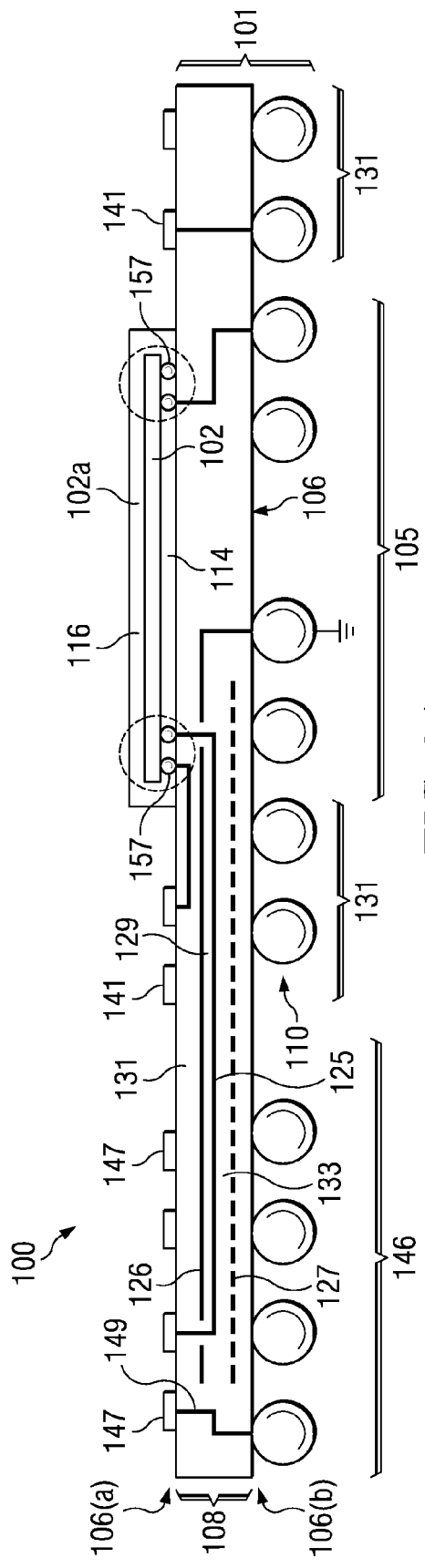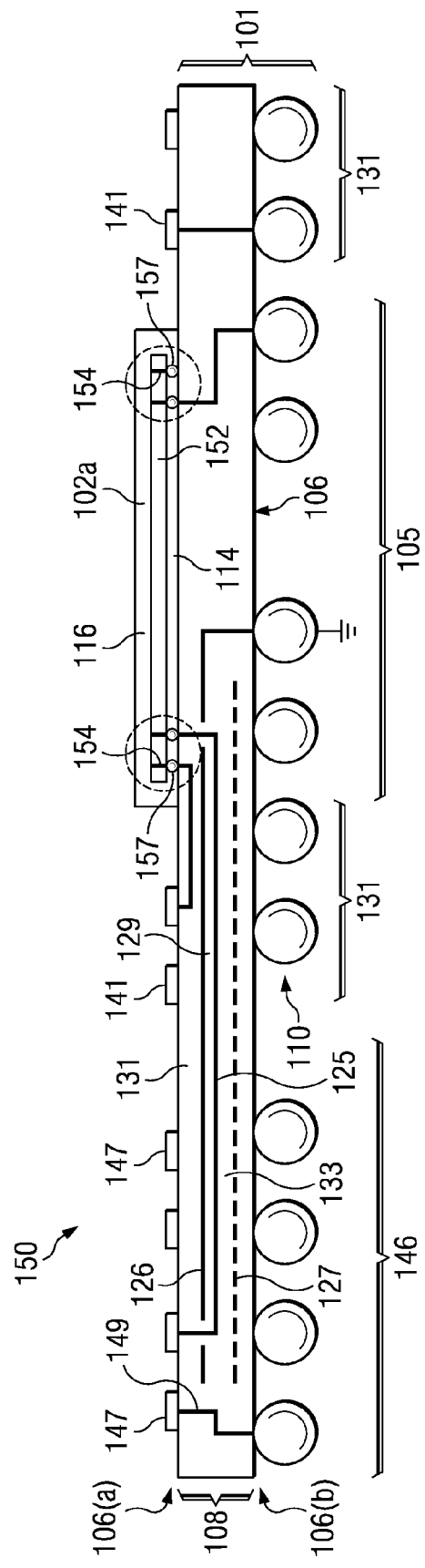

INTEGRATED CIRCUIT STACKED PACKAGE PRECURSORS AND STACKED PACKAGED DEVICES AND SYSTEMS THEREFROM

CROSS REFERENCE TO RELATED APPLICATIONS

This application is a divisional of application Ser. No. 12/388,976 filed Feb. 19, 2009 and claims priority to the following United States provisional patent applications, (i) 61/029,812 filed Feb. 19, 2008, entitled "Stacked Package with Multiple Active and Passive Elements", (ii) 61/029,814, filed Feb. 19, 2008, entitled "Stacked Package with Memory and Passive Elements", and (iii) 61/141,735 entitled "Integrated Circuit Package" filed Dec. 31, 2008, all incorporated herein in their entireties into the present application.

FIELD OF THE INVENTION

Embodiments of the present invention are directed to integrated circuit (IC) comprising lateral stacked package precursors and IC comprising lateral stacked packages therefrom, and more particularly to IC comprising lateral stacked package precursors and IC comprising lateral stacked packages therefrom having both RF active and RF passive circuit elements.

BACKGROUND

As the demand for faster, smaller electronic products with increased functionality is increased, stacked packaging schemes, such as package-on-package (POP) packaging, have become increasingly popular. The stacking of different semiconductor packages using stacked packages typically reduces the required footprint size for a semiconductor package in an electronic product. Furthermore, stacked packages can provide a modular solution for constructing electronic devices by permitting different combinations of stacked semiconductor packages using only a few semiconductor package footprints.

Many advanced electronic packages and devices typically include analog and digital circuits in the same electronic device or system. In these so-called "mixed-signal" devices, signals are typically susceptible to degradation as the signals traverse the various components of the electronic device. Furthermore, the analog signals are generally susceptible to electromagnetic interference (EMI) and the presence of digital signals in the vicinity of the analog components. This susceptibility generally allows the EMI from the digital circuits to couple directly into the analog sections of the mixed-signal device, generally resulting in noise being introduced into the analog signals.

For example, even though typical CMOS digital devices in a high speed digital circuit generally have a low quiescent current, simultaneous switching noise (SSN, also known as ground bounce) caused by the CMOS circuit switching current, can be a significant source of EMI to the analog section of mixed signal device leading to increased noise. Additionally, some analog signals can be susceptible to EMI caused by high level signals from other analog circuits, particularly those which swing nearly a full supply voltage range, also resulting in increased noise.

SUMMARY OF THE INVENTION

This Summary is provided to comply with 37 C.F.R. §1.73, providing a summary of the invention briefly indicating the nature and substance of the invention. It is submitted with the understanding that it will not be used to interpret or limit the scope or meaning of the claims.

A first embodiment of the present invention comprises a package-on-package (POP) package precursor. As used herein, a "POP precursor" refers to a partially completed IC comprising device that generally includes an electronic board substrate (e.g. PCB) having at least one IC die attached thereon, first attach pads configured for later mounting a first IC on top of the assembled IC to form a first POP, and a lateral portion of the board having second attach pads for mounting passives and/or other ICs and optionally stacking additional devices thereon to form a second POP.

The electronic board substrate includes a plurality of electrically conductive layers (e.g. metal traces) that provides electrical coupling between the IC and the attached pads. The first IC is coupled to the first attach pads, and the passives and/or other ICs device(s) are coupled to the second attach pads. In a typical application, a customer obtains a POP package precursor according to an embodiment of the invention, and adds or has a sub-contractor add circuitry to customize the POP precursor to provide a finished system in a package (SIP), such as by adding a memory module on the IC die, and RF circuitry on the second pads on the lateral portion.

In other embodiments of the present invention, a package-on-package (POP) comprising IC comprises an electronic substrate comprising a plurality of electrically conductive layers separated by a plurality of dielectric layers. The electronic substrate provides a top surface. A first portion of the top surface has an IC die attached thereon electrically coupled thereto. A second portion of the top surface has a plurality of first attach pads positioned on opposing sides of the IC die having exposed electrically conductive surfaces. At least a first electronic device is coupled to the plurality of first attach pads and positioned on top of the IC die. A least a third portion of the top surface is positioned laterally with respect to the first and second portion of the top surface, wherein the third portion includes a plurality of second attach pads having exposed electrically conductive surfaces. At least a second electronic device electrically is coupled to the second attach pads. At least one of the plurality of electrically conductive layers comprises a coupling trace that electrically couples at least one of the plurality of second attach pads to at least one of the IC die and at least one of the plurality of first attach pads. In one embodiment the POP IC comprises a memory module (SRAM, DRAM or flash memory), an ASIC module (baseband processor, applications processor digital radio, BT/FM/GPS) and an RF module including an RF transceiver.

BRIEF DESCRIPTION OF THE DRAWINGS

FIG. 1A shows a cross sectional view of an exemplary package-on-package (POP) package precursor having a flip chip IC die, according to an embodiment of the invention.

FIG. 1B shows a cross sectional view of an exemplary POP package precursor having a face up IC die that includes through wafer vias, according to an embodiment of the invention.

DETAILED DESCRIPTION

Figure 2A:
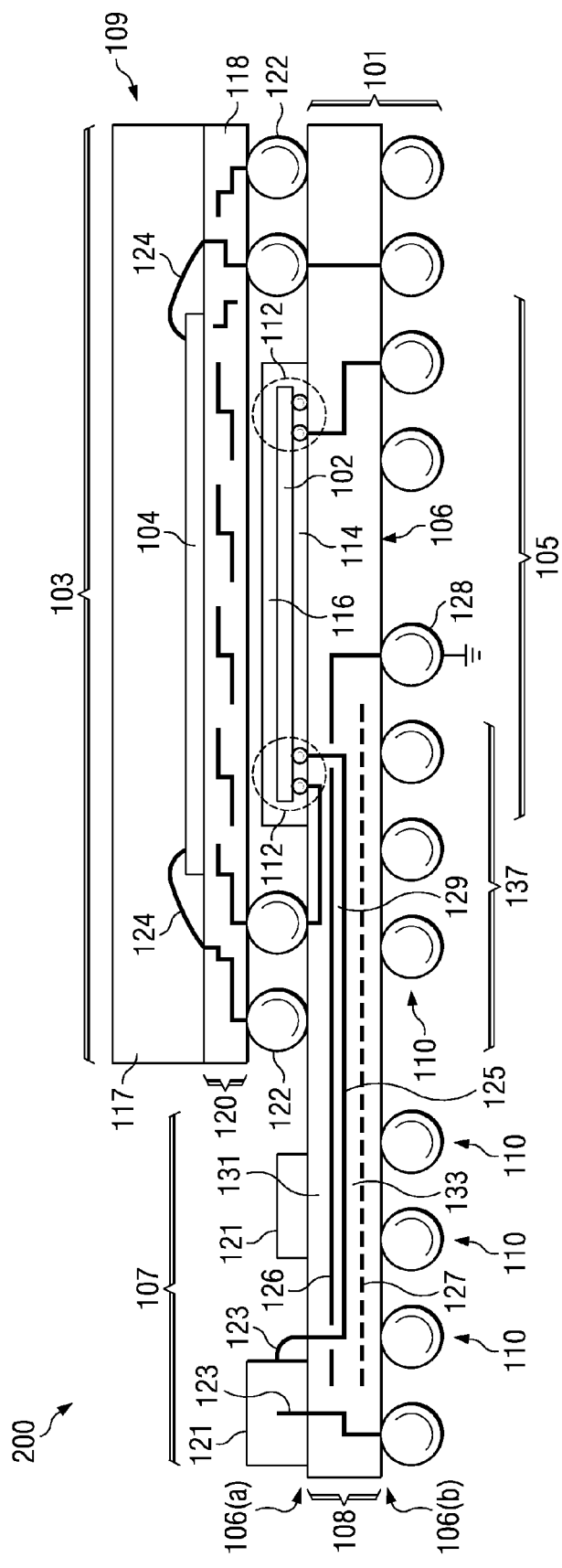
FIG. 2A shows a cross-section of an exemplary IC device arranged according to an embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1A shows a cross sectional view of an exemplary POP package precursor 100 having a flip chip IC die, according to an embodiment of the invention. POP package precursor 100 comprises an electronic substrate 106, such as a printed circuit board (PCB), comprising a plurality of electrically conductive layers 125, 126, 127 collectively referred to as conductive layers 108, which are separated by a plurality of dielectric layers 129, 131, 133. The electronic substrate 106 provides a top surface 106(a) and a bottom surface 106(b) and a plurality of electrical conduits 149 for electrically coupling a plurality of locations on the top surface 106(a) to a plurality of locations on the bottom surface 106(b). A first portion 105 of the top surface 106(a) has a flip chip oriented IC die 102 having optional encapsulation material 116 thereon. IC 102 is electrically coupled to top surface 106(a) in first portion 105 by the bumps 157 shown and is secured to the top surface 106(a) by die attach (underfill) material 114. A second portion 131 of the top surface 106(a) has a plurality of first attach pads 141 positioned on opposing sides of the IC die (102) having exposed electrically conductive surfaces for electrically coupling to at least a first electronic device on top of the IC die 102. As used herein "attach pads" can comprise surface mount (SMT) pads, wire bond pads, flip chip pads, or sockets.

At least a third portion 146 of the top surface area 106(a) is positioned laterally with respect to the first and second portions 105, 131 of the top surface 106(a), wherein the third portion 146 includes a plurality of second attach pads 147 having exposed electrically conductive surfaces configured for electrically coupling to at least a second electronic device. The encapsulation material 116 is not shown over the second 131 and third portion 146 to facilitate additional assembly activity (i.e. mounting of additional devices). At least one of the plurality of electrically conductive layers 125, 126, shown in FIG. 1A as coupling trace 125, electrically couples at least one of the plurality of second attach pads 147 to at least one of the (i) IC die 102 and (ii) plurality of first attach pads 141.

In one embodiment the IC die 102 comprises digital logic. In another embodiment the plurality of first and second attach pads can comprise a plurality of surface mount pads. As shown in FIG. 1A, electrically conductive layers 126 and 127 provide a shield region for trace 125. "Shield regions" as used herein comprises electrically conductive regions (e.g. metal lines) that do not provide an interconnect function. Electrically conductive layers 126 and 127 can be seen to be arranged in an overlapping arrangement to provide a coaxial shield region for at least a portion of a length of trace 125.

Embodiments of the present invention include IC devices (e.g. SIPs) that include digital and analog components that address the EMI noise problem that can degrade performance of the analog portions and thus the performance of the overall IC device. Because of the increased proximity between the various devices in such an arrangement, EMI interference can be generated when digital IC devices are placed in proximity to analog ICs and discrete devices. As described above, digital devices (and some analog devices) can generate EMI that can induce significant noise on electrical traces carrying some types of analog signals. Therefore, in some embodiments of the present invention, EMI shielding and bundling of reduced dimension lines can be used to further enhance operation of the electronic device without having to increase trace spacings or reduce the number of signals being exchanged. For example, the Present Inventors have discovered that by placing the EMI generating components in only specific portions of the IC device and by shielding electrical traces that carry EMI sensitive analog signals in these portions of the IC device, the amount of EMI-induced signal degradation can be significantly reduced.

As described above, embodiments of the present invention provide a IC device including a base IC package having at least first and second portions for attaching and/or stacking analog and/or digital circuit components. In some embodiments of the present invention, the first portion (EMI-generating portion) can be used for attaching noise-inducing devices, such as EMI generating digital or analog devices. The second portion (EMI-passive portion) can be used for attaching other devices EMI passive or EMI resistant devices, such as other types of analog devices or even digital devices generating amounts of EMI insufficient to induce significant noise levels to an electrical trace that carries a noise susceptible analog signal.

Analog components, as used herein, refers to components or a combination of components including, but not limited to RF active analog ICs such as transceivers, power amplifiers (PA) and RF crystal (XTL) switching circuitry, and passives such as surface acoustic wave (SAW) devices, capacitors, inductors, balons, and resistors. RF active analog ICs, as used herein, refers to analog circuits that during normal operation switch at frequencies generally >1 MHz. Digital components, as used herein, refer to components commonly used for processing, transferring, and/or storing data, including, but not limited to: memory modules (SRAM, DRAM, flash memory, etc. . . . ), application specific integrated circuits (ASICs), base band processors, applications processors, and digital radio processors.

In other embodiments of the invention, IC die may also be arranged in a face up arrangement. FIG. 1B shows a cross sectional view of an exemplary package-on-package (POP) package precursor 150 having a face up IC die 152 that includes through wafer vias 154 (also known as through substrate vias (TSVs)), according to an embodiment of the invention. As known in the art, IC die 152 in a face up configuration having through wafer vias 154 is adapted for receiving one or a plurality of through wafer via comprising IC die stacked thereon (not shown). Bumps 157 are shown as micro-bumps. IC die 152 generally includes a redistribute layer (RDL; not shown) on its backside coupled to through wafer vias 154, wherein the redistribute layer is coupled to the micro-bumps 157.

FIG. 2A shows an exemplary IC device 200 arranged according to an embodiment of the present invention. IC device 200 can include a base package or base IC device 101 comprising a base electronic substrate 106 with EMI passive portion 107 and EMI generating portion 103. EMI passive portion 107 corresponds to third portion 146 shown in FIGS. 1A and 1B. In FIG. 2A, the EMI passive portion 107 is used for attaching one or more EMI passive components 121 to attach pads on the base substrate 106 while the EMI generating portion 103 is used for attaching one or more EMI generating components shown as first EMI generating IC die 102 and second EMI generating IC die 104 stacked on one another and both attached to attach pads on the base substrate 106.

As used herein, "EMI generating components" refers to analog or digital components that during operation generate sufficient EMI to induce noise in an electrical trace carrying an analog signal, while "EMI passive components" refers to analog or digital components which generate insufficient EMI levels to induce noise in an electrical trace carrying an analog signal. The term "electronic substrate", as used herein, generally refers to any type of PCB used for forming package substrates. In embodiments of the present intervention, electronic substrates can be constructed using a variety of techniques. By way of example, and not by way of limitation, electronic substrates can be constructed using laminate substrate technologies, including rigid and/or flexible laminate technologies, and ceramic substrate technologies, including thin film, thick film, and co-fired (HTCC, LTCC) ceramic technologies.

The base electronic substrate 106 can include a plurality of dielectric layers 129, 131, 133 and electrically conducting layers 108 to couple components attached to either of portions 103 and 107 to circuit coupling features 110 of the base electronic substrate 106 or to each other. For example, as shown in FIG. 2A, first EMI generating IC die 102 can be electrically coupled to a first portion 105 of the base substrate 106 using one or more electrical bonding features 112 on the first EMI generating die 102, the base substrate 106, or both. In the exemplary circuit in FIG. 2A, a flip-chip arrangement is illustrated. However, embodiments of the invention are not limited in this regard and the first EMI generating IC die 102 can also generally be electrically coupled to the base substrate 106 generally using any other type of electrical bonding methods, including wire bonding or tab bonding methods. The first EMI generating IC die 102 can also be mechanically coupled to the substrate 106 generally using any type of adhesive material. For example, as shown in FIG. 2A, underfill 114 and/or molding compound 116 materials can be used to mechanically couple and protect the first EMI generating IC die 102 to the base substrate 106.

In some embodiments of the present invention, the first EMI generating IC die 102 can be a controller or processor IC. Such a configuration allows the base package to be configured with a particular ASIC to provide basic functionality and permits other EMI passive or EMI generating components to be selectively added at a later time. For example, in a RF communications package, a customized RF controller IC, which can comprise multiple combinations of EMI sensitive and EMI generating components, can be first attached to the base IC device 101 and provided to a RF device manufacturer to complete manufacturing of the IC device. The RF device manufacturer can customize the IC device 101 by attaching the controller IC and the memory device(s) to the EMI generating portion 103 and the RF components to the EMI passive portion 107 according to device requirements, cost, or other factors.

A second IC device 109, which can include a second EMI generating die 104 mounted onto a second electronic substrate 118, can be stacked over the first EMI generating die 102, for example using a POP arrangement. The POP arrangement can also allow addition IC devices (not shown) to be stacked on top of IC device 109. However, embodiments of the present invention are not limited solely to POP-type packages for the second IC device 109 and other IC package technologies can be used for forming the second IC device 109.

The second electronic substrate 118 can also include a plurality of dielectric and electrically conducting layers 120 to couple the second die 104 to second coupling features 122 of the second electronic substrate 118 and/or the base electronic substrate 106. In the exemplary circuit in FIG. 2A, a flip-chip arrangement is illustrated for the base substrate 106 and the second IC device 109. As previously described, embodiments the invention are not limited in this regard and the second IC device 109 can also be electrically bonded to the base substrate 106 using other bonding methods, such as wire bonding, tab bonding or using through wafer via connections if provided. The second EMI generating die 104 can be electrically coupled to the second substrate 118 using one or more electrical bonding features 124 on the second EMI generating die 104, the second substrate 118, or both. In the exemplary circuit shown in FIG. 2A, a wire bond arrangement is illustrated for the second EMI generating die 104. As previously described, embodiments of the invention are not limited in this regard and the second EMI generating die 104 can also be electrically bonded to the second substrate 118 using other bonding methods, such as flip chip, tab bonding or using through wafer via connections. The second EMI generating die 104 can also be mechanically coupled to the second substrate 118, as described above for the first EMI generating die 102 and the substrate 106 using underfill (not shown) or molding compound layers 117. In some embodiments of the invention, one or more additional EMI generating dies (not shown) can be stacked on top of the second EMI generating die 104.

In embodiments of the present invention, the EMI generating components comprising first and second EMI generating die 102 and 104 are attached to the base substrate 106 in the EMI generating portion 103, which is laterally positioned with respect to the EMI sensitive portion 107. The length of EMI sensitive portion 107 is generally 0.5 mm to 20 mm. As shown in FIG. 2A, the EMI passive components 121 can be attached to any portion of the EMI sensitive portion 107. Each of the EMI passive components 121 can be electrically coupled to the base substrate 106 (and thus the other components mounted thereon) using one or more electrical bonding features 123 on the EMI passive components 121, the base substrate 106, or both. In the exemplary circuit in FIG. 2A, a wire bond arrangement using bond wires 123 is illustrated for the EMI passive components 121. Embodiments of the invention are not limited in this regard and the EMI passive components 121 can also be electrically bonded to the substrate 118 using other bonding methods for discrete components.

In some embodiments of the invention, the type of bonding and coupling features selected for attaching the EMI passive component 121 and the second IC device 109 can be selected to simplify assembly. For example, if reflow-based bonding and coupling features are selected, then attachment of the EMI passive component 121 and the second IC device 109 requires only placement of the components and a single subsequent reflow step.

As described above, the various components attached to the base substrate 106 can be interconnected via the plurality of electrically conductive layers 108 in the base substrate 106. In embodiments where the first EMI generating die 102 is a controller IC for the EMI passive components 121, the EMI passive components 121 and the first EMI generating die 102 can be connected via at least one interconnection trace 125 in the base substrate 106. However, as previously described, the signals provided on the interconnection trace 125 can be susceptible to EMI and noise can be introduced into an analog signal carried by the trace 125, thus being able to adversely affect the operation of the IC device 200.

To provide EMI shielding for these EMI sensitive traces 125 in IC device 200, a shield region 126 is shown in FIG. 2A which can be formed within the base substrate 106 in a area defined by a path of the interconnection trace 125. In particular, the shield region 126 can be formed between the upper surface of substrate 106 and a portion 137 of trace 125 extending under the EMI generating portion 103. In some embodiments, a lower shield region 127 can also be provided. In such embodiments, the coaxial nature of the EMI shielding provided by regions 126 and 127 provides enhanced shielding for trace 125. Regardless of the number of shield layers, the shield layers can extend over at least a majority of the length of the portion 131 of trace 125. That is, >50% over the length of the portion of the trace 125 under the EMI generating portion 103.

Although two EMI generating IC die (102, 104) are shown in FIG. 2A, one of ordinary skill in the art will recognize that the various embodiments of the present invention can be implemented in IC devices having any number of stacked dies, including EMI generating and EMI passive IC die, as well as any number of electronic substrates. Furthermore, although embodiments of the present invention provide for placing EMI generating components within the EMI generating portion, EMI passive components can be placed in either the EMI generating portion or the EMI passive portion. Additionally, even though EMI shield layer 126 is shown to be a single region that extends along the length of the trace 125, embodiments of the invention are not limited in this regard. One of ordinary skill in the art will recognize that the EMI shield layer 126 can generally have any size and need only extend over a portion of the area between the dies. Furthermore, multiple shield regions can be used to protect different portions of the dies.

Figure 2B:
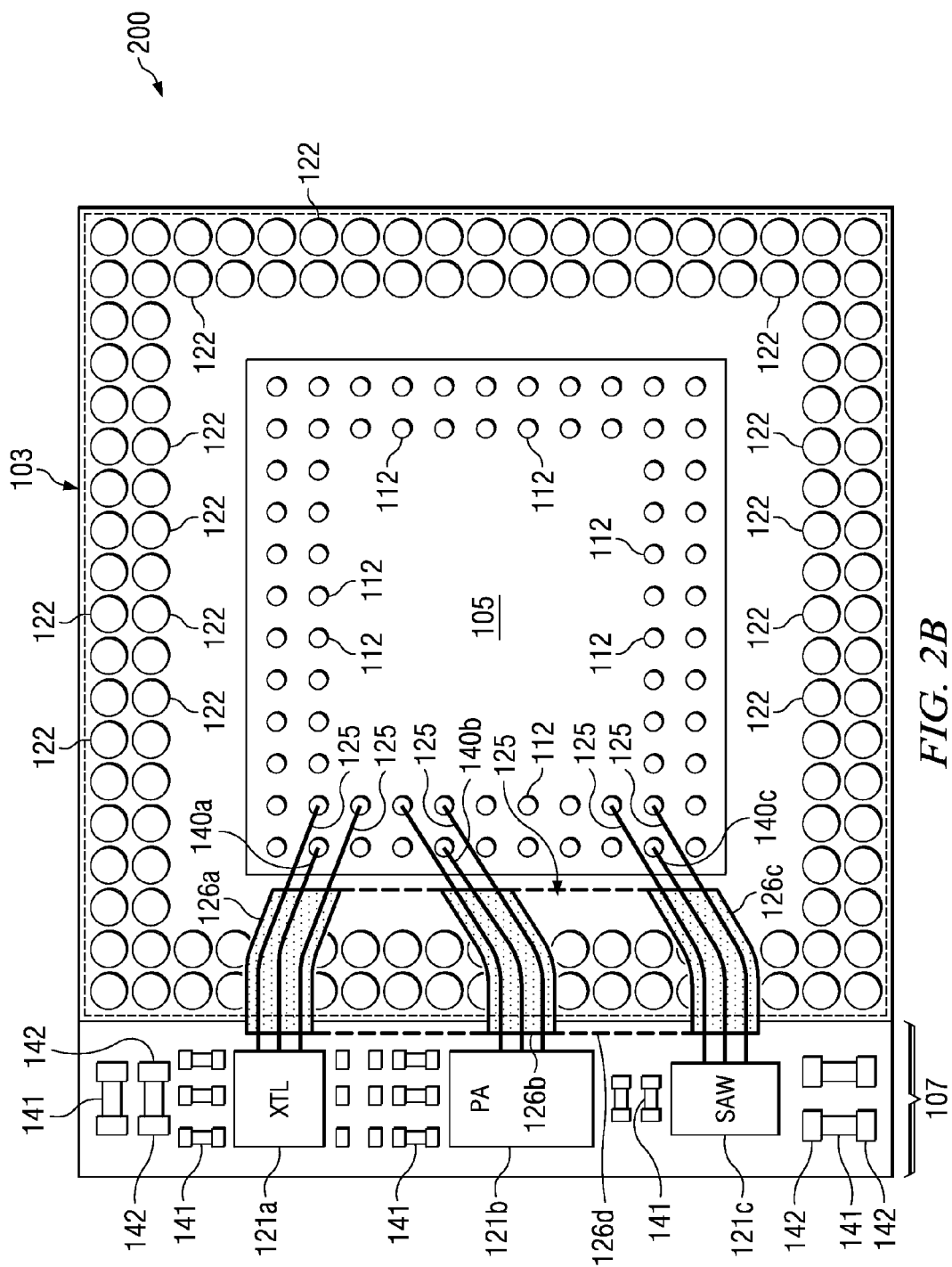
FIG. 2B shows a top-down view of a portion of an exemplary IC device arranged according to an embodiment of the present invention.

For example, FIG. 2B shows a top-down view of a portion of IC device 200 shown in FIG. 2A with the substrate 118 and the first EMI generating IC die 102 removed. In FIG. 2B, three EMI passive components 121a, 121b, and 121c which are coupled to attach pads thereunder (not shown) are coupled to the bonding features in first die area 105 via the attach pads which are coupled to first die area 105 via traces 125. In portion 107, discrete devices 141, such as resistors and capacitors are shown attached to some of the plurality of attach pads 142 provided. To protect the signals on traces 125 from noise pick up, shields 126a, 126b, and 126c are provided for shielding each set of traces 125 coupling to different ones of EMI passive components 121a, 121b, and 121c. However, embodiments of the invention are not limited in this regard and shield regions 126a, 126b, and 126c can be merged in some embodiments to form a single shield area 126d (shown by the dashed line).

Although FIGS. 2A and 2B only show an IC device having a substrate with EMI generating dies and adjacent EMI passive components attached directly to the same base substrate 106, embodiments of the invention are not limited in this regard. In some embodiments, the EMI passive components can be attached to EMI passive dies that can be disposed in the EMI passive portion 107. Such a configuration is shown in FIGS. 3A and 3B.

Figure 3A:
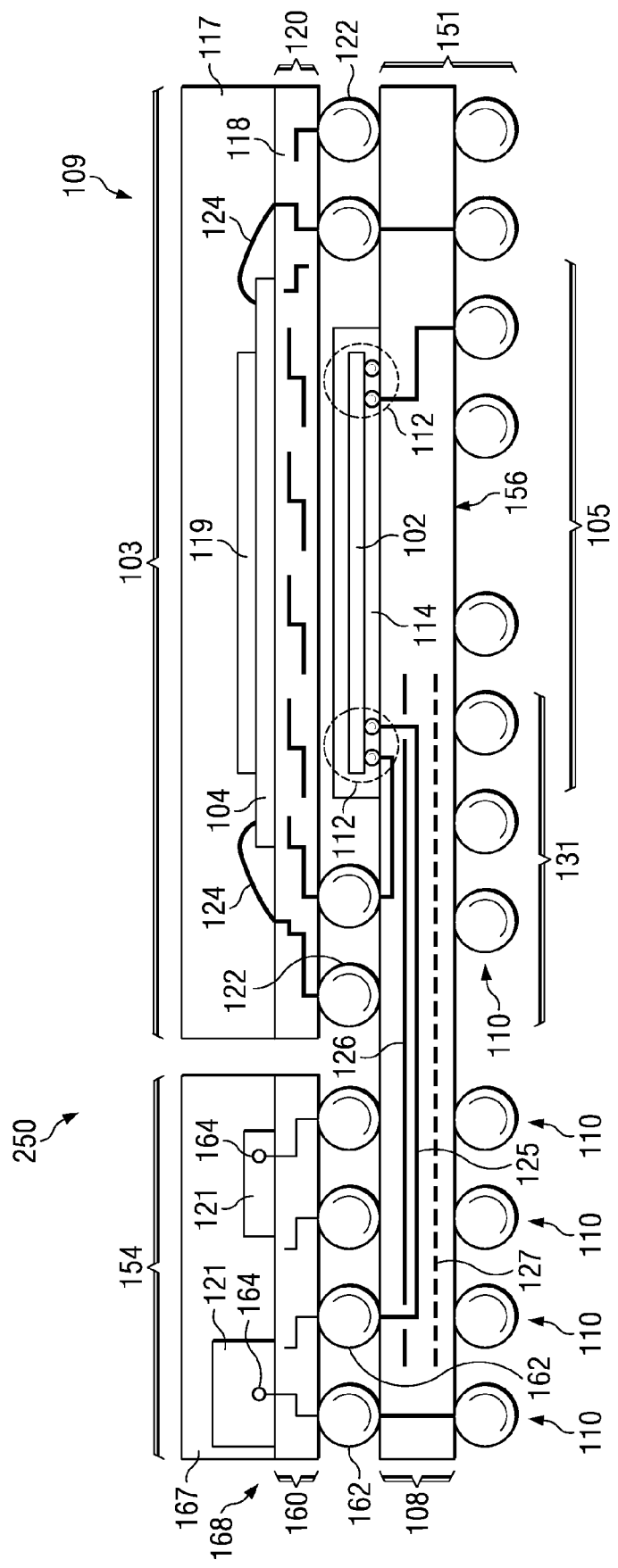
FIG. 3A shows a cross-section of an exemplary IC device arranged according to another embodiment of the present invention.
Figure 3B:
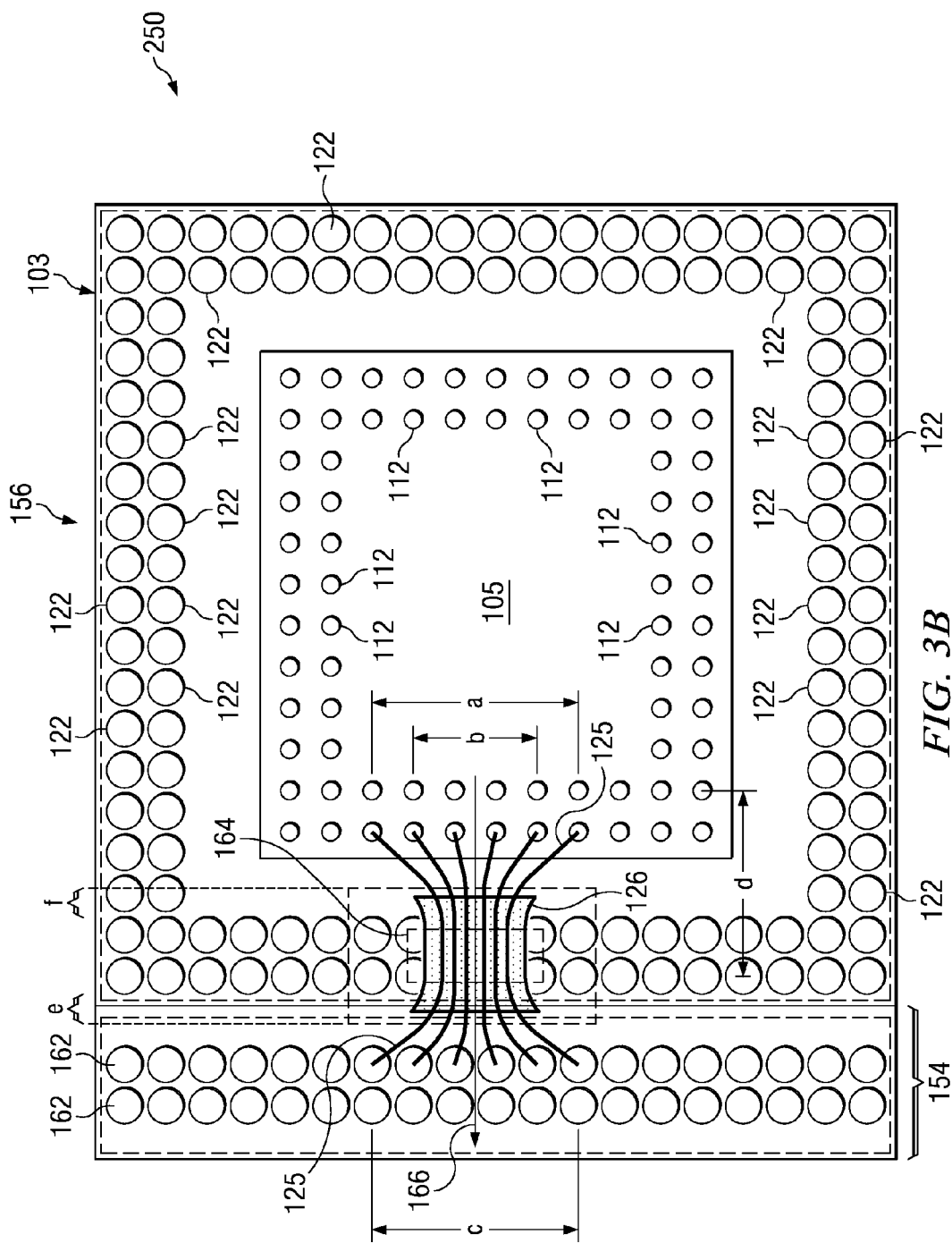
FIG. 3B shows a top-down view of a portion of an exemplary IC device arranged according to another embodiment of the present invention.

In FIG. 3A, a cross-section of an IC device 250 configured according to an embodiment of the present invention is shown. IC device 250 is similarly configured to IC device 200 shown in FIG. 2A with respect to the stacking of EMI generating dies in the EMI generating portion 103. However, as shown in FIG. 3A, the base package 151 includes a base substrate 106 in EMI passive portion 154 configured for forming a stacked or POP arrangement of EMI passive components 121.

As shown in FIG. 3A, the EMI passive components 121 can be mounted onto a third electronic substrate 168 stacked over the EMI passive interface region 154. The third electronic substrate 168 can also include a plurality of dielectric and electrically conducting layers 160 to couple at the EMI passive components 121 to third coupling features 162 of the third electronic substrate 168 and/or the base electronic substrate 156. In the exemplary circuit in FIG. 3A, a flip-chip stacked arrangement is illustrated for the base substrate 156 and the third substrate 168. As previously described, embodiments of the invention are not limited in this regard and the third substrate 168 can also be electrically bonded to the base substrate 156 using other bonding methods, such as wire bond or tab bonding. The EMI passive components 121 can be electrically coupled to the third substrate 168 using one or more electrical bonding features 164 on the EMI passive components 121, the third substrate 168, or both. In the exemplary circuit in FIG. 3A, a wire bond arrangement is illustrated for the EMI passive components 121. As previously described, embodiments of the invention are not limited in this regard and the EMI passive components 121 can also be electrically bonded to the third substrate 168 using other bonding methods, such as flip chip or tab bonding.

The EMI passive components 121 can also be mechanically coupled to the third substrate 168, as described above for the first EMI generating die 102 and the base substrate 106 as shown in FIG. 3A using underfill (not shown) or molding compound layers 167. Although discrete EMI passive components 121 are illustrated in FIG. 3A, embodiments of the invention are not limited in this regard. In some embodiments, the EMI passive components can comprise EMI passive IC dies or a combination of EMI passive IC dies and discrete EMI passive components. In embodiments using EMI passive IC dies, one or more additional EMI passive IC dies (not shown) can be stacked on top of other EMI passive IC dies, as previously described for EMI generating dies in FIG. 3A.

Although the EMI passive portion 154 is configured for forming a stacked arrangement of EMI passive components, the shield region 126 can be similarly configured as described above with respect FIGS. 2A and 2B. For example, FIG. 3B shows a top-down view of IC device 250 shown in FIG. 3A with the third substrate 168, the second substrate 118, and the first EMI generating die 102 removed. As described above, one or more shield regions 126 can be formed over the traces that carry noise susceptible analog signals.

The Present Inventors note that the basic requirements for forming an effective EMI shield to protect EMI sensitive portions is that the shield should be formed of an electrically conductive material (e.g. metal or highly doped semiconductor) and have a sufficient thickness. That is, the thickness should be sufficiently large such that the EMI affects only an outer portion of the thickness (the frequency dependent skin depth) of the EMI shield layer. The thickness required can vary as the electrical conductivity of the enclosure material varies and as the type of EMI varies. Generally, as electrical conductivity of the shield layer material increases, the thickness of material required to block EMI decreases and vice versa. Therefore, an electromagnetic shield layer requires a layer that is not only electrically conductive, but that has a thickness greater than a skin depth for the EMI to be blocked. In cases where the EMI generating IC is shielding the EMI source, the same principles generally apply with the exception that skin depth is measured from the interior of the enclosure. For example, in one particular embodiment, the electrical conductive (e.g. metal) shield layer thickness for providing adequate shielding from adjacent RF-generating IC's and/or trace can be at least 10 um of an alloy primarily comprising copper, such as between 15 and 20 um thick.

In embodiments of the present invention, various shield layer designs can be used to block EMI. In some embodiments, solid shield regions can be formed. However, a solid configuration can result in poor adhesion between the multiple layers of the base substrate and can lead to reliability failures of the base substrate due to delamination. In other embodiments, a shield layer having a regular pattern of non-planar features such as openings can instead be used. However, if the area of the openings is too large, some wavelengths of generated EMI can penetrate the shield. Therefore, to provide adequate adhesion and sufficient EMI blockage, some embodiments of the present invention provide an EMI shield region having solid areas overlapping EMI reactive traces and having an aperiodic arrangement of openings elsewhere. A "solid area" of the EMI shield region, as used herein, refers to an area of the EMI shield region having no openings in the EMI shield layer.

Figure 4:
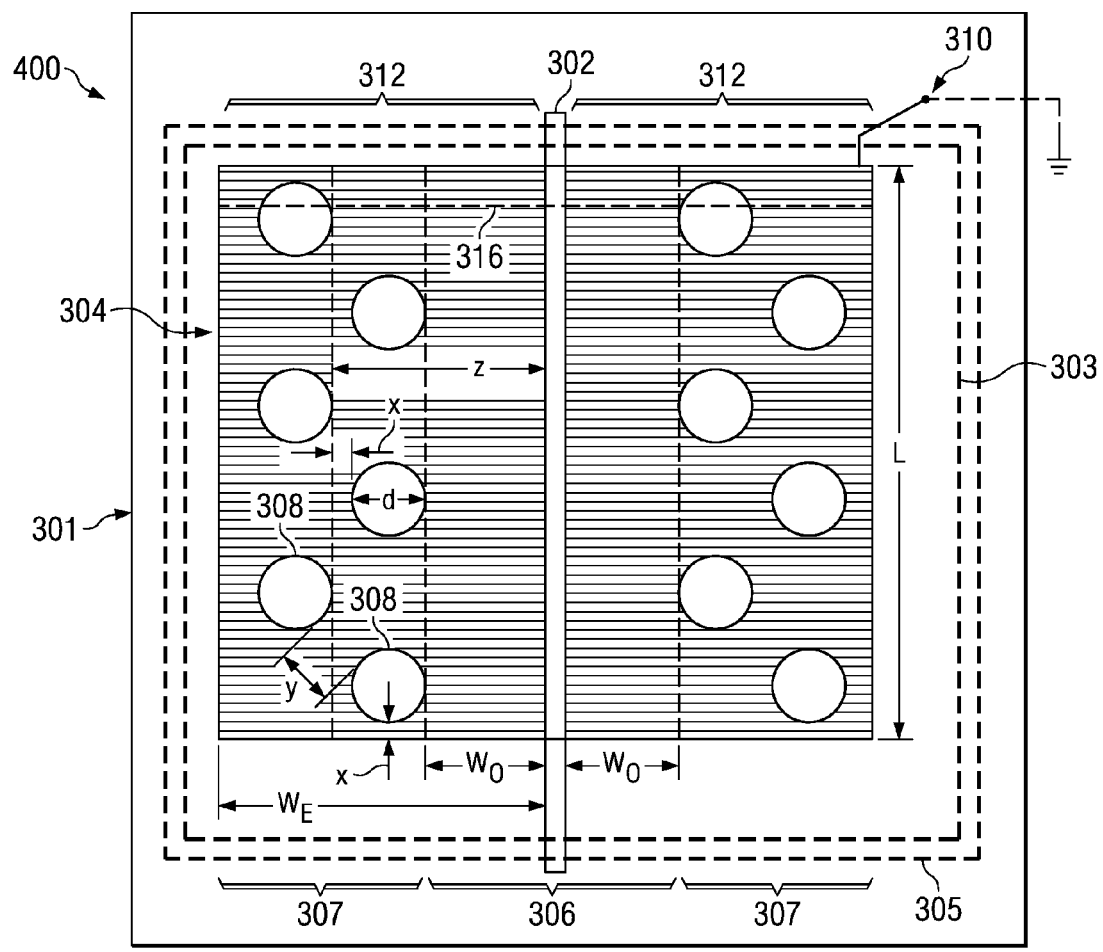
FIG. 4 shows a schematic of a portion of an EMI shield region according to an embodiment of the present invention.

FIG. 4 shows a schematic of a portion of an IC device 400 including an EMI shield region according to an embodiment of the present invention. As shown in FIG. 4, IC device 400 can include one or more electrical traces 302 that need to be shielded from EMI generated by a first functional die 303 (footprint shown by dashed lines), an electronic substrate 301, or a second functional die 305 (footprint shown by dashed lines). Although a first functional die 303 is shown to be smaller than both the second functional die 305 and the electronic substrate 301, embodiments of the invention are not limited in this regard. In embodiments of the present invention, the sizes of the various components can vary according to the design required for the IC device 300.

In embodiments of the present invention using aperiodic opening arrangements in the shield layer, at least one shield region 304 can be formed for the IC device 400 on the electronic substrate 301. The shield region 304 can be coupled to a grounding terminal 310 of the IC device 400. To provide sufficient EMI shielding, the shield region 304 can include at least one solid area 306 and one or more enhanced adhesion areas 307 having one or more openings 308. In some embodiments, the shield region 304 can have a width equal to that of the shielded trace 302 to be shielded (i.e., $W_O=0$). In other embodiments, the shield region 304 can overlap the edges of the traces 302 by at least a minimum amount $W_O$. Such an overlap reduces EMI reaching the traces 302 from EMI generating portions of dies 303 or 305 via diffraction effects at the edges of the shield region 304 or due to EMI traversing the IC device at angles other than perpendicular to the shield region 304. Accordingly, one of ordinary skill in the art will recognize that the minimum trace overlap $W_O$ can vary as the distance between the traces 302 to be protected and the shield region 304 varies.

As described above, the openings 308 in the shield region 304 are provided for promoting adhesion of the shield region 304 to the electronic substrate 301 underneath the shield region 304. Accordingly, as shown in FIG. 4, the adhesion regions 307 can include one or more openings 308 that provide a sufficient surface area to promote good adhesion. In the various embodiments of the present invention using aperiodic opening arrangements in the shield layer, the width of the openings 308 can vary between 10 um and 300 um, such as 50 um, 100 um, 150 um, and 300 um. Furthermore, to further ensure a sufficient area to promote reliable adhesion of the shield region 304, the number and size of the openings 308 can be selected depending on process conditions, IC design, and package design. Typically, as the area of the openings is increased, less shielding is provided, albeit with better adhesion. As the area of the openings is decreased, more shielding is provided, but with less adhesion. As one of ordinary skill in the art will recognize, the number and size of openings may be ultimately limited based on the wavelength of the EMI in question and the particular manufacturing process. For example, some electronic substrate materials can require a larger surface area for reliable adhesion. Therefore, the area of the openings can comprise between 30% and 80% of the total area of the shield region 304. In some embodiments, this range can be limited based on process conditions to between 35% and 75% or between 30% and 70%.

Although FIG. 4 only shows round openings 308 having the same size, the various embodiments of the present invention are not limited in either of these regards. For example, in embodiments of the present invention using aperiodic opening arrangements in the shield layer, openings of any geometry, including that of polygons, ellipses, or other shapes, can be used to form openings.

In embodiments of the present invention using aperiodic opening arrangements in the shield layer, the number and position of the openings can also vary depending on the total area and geometry of portions 312 of the shield region 304 extending beyond the edges of the traces 302. Although the extending portion 312 is shown in FIG. 4 to extend from an edge of the electrical trace 302 to the edge of the shield region 304, embodiments of the present invention are not limited in this regard. In some embodiments of the present invention using aperiodic opening arrangements in the shield layer, extending portions 312 (and thus the enhanced adhesion areas 307) can be bounded by one or more electrical traces, by one or more edges of the shield region 304, or any combination thereof.

As the number of openings 308 in an shield region 304 is increased, an increased area of the electronic substrate 301 is exposed and the likelihood of good adhesion of the underfill and molding layers generally increases. However, as the size of the openings is further increased or their spacing is decreased, the openings 308 can become more poorly formed in the shield region 304. In some cases, this can cause some of the openings 308 to encroach on the solid portions 306. This encroachment can reduce the effectiveness of the shield region 304 in blocking EMI. Therefore, in the various embodiments of the present invention using aperiodic opening arrangements in the shield layer, the position and number of openings can be dependent on one or more design rules. The design rules can be used to then determine the maximum number of openings can be placed without significantly affecting the integrity of the solid areas 306 of the EMI shield region. That is, the design rules ensure that after the integrated circuit device 400 is formed, the solid areas 306 remain of a sufficient width to block EMI, as previously described.

A first design rule can be that the distance (x) between the edge of an opening 308 and an edge of the shield region 304 should be greater than or equal to a minimum edge to edge spacing. A second design rule can be that the distance between adjacent openings 308 should also be greater than or equal to a minimum edge to edge spacing (y). One of ordinary skill in the will recognize that this spacing can be the same or different in the various embodiments of the present invention. The third design rule can be that the minimum lateral distance between any traces being shielded and an edge of an opening 308 should be at least the minimum width ($W_O$) for the shield region. Accordingly, one of ordinary skill in the art will recognize that for a round opening 308 having a diameter d, the extending portion 312 needs to have at least an area equal to $W_E \cdot L$, where $L \geq d+2x$ and $W_E \geq x+d+W_O$. However, the invention is not limited in this regard. In some embodiments, an opening 308 can overlap with an edge of the shield region 304 (i.e., $x \leq 0$) as shown by edge 316 in FIG. 4.

Figure 5:
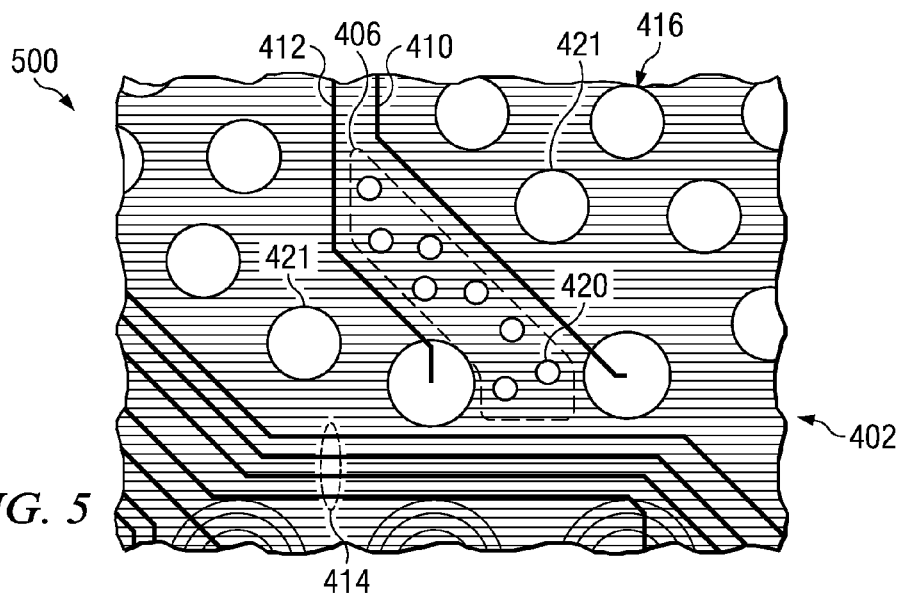
FIG. 5 shows an exemplary layout of a portion of an IC device according to an embodiment of the present invention.

The aperiodic arrangement of openings results because the arrangement of the openings is based on the geometry of each of the individual enhanced adhesion areas as opposed to the overall geometry of the EMI shield region. Accordingly, variations in the area and geometry of each enhanced adhesion area results in variations in the number and placement of openings. However, the shield layers are not limited to solely an aperiodic distribution of openings of a single size, as shown in FIG. 4, but can include an aperiodic distribution of openings of different sizes, as shown in FIG. 5. The different sizes allow smaller openings to be inserted in adhesion regions that would not typically allow placement of larger sized openings.

Such a configuration can be advantageous for reducing the amount of solid portions of the shield region. For example, referring back to FIG. 3B, the traces 125 are shown connecting coupling features 112 along length a to coupling features 162 along length c and separated by distance d. If a straight line path were to be used to couple the features 162 and 112, the area of the shield region would be defined by the perimeter based on dimensions a, c, and d. However, as shown in FIG. 3B, if at least portions or segments 164 or of the traces are place in close proximity or "bundled" along a common path area 166, at least a portion of the shield 126 can be narrowed to a width b improve adhesion by reducing the overall area of the shield 126. That is, at least segments 164 of the traces 125 between the EMI sensitive portion 107 and EMI generating portion 103 are placed to provide a minimum spacing. Such positioning or repositioning of bundled segments 164 can occur during initial design of the base substrate 106 or during placement of the shield region 126. Although only a single bundle is shown in FIG. 3B, one of ordinary skill in the art will recognize that any number of bundles and/or path areas can be used in other embodiments. For example, as shown in FIG. 2B, three path areas 140a-c are shown. However, in areas of the shield 126 where the traces 125 begin to separate 126 (areas e and f), the spacing between the traces 125 may be insufficient for placing openings to improve adhesion. In such cases, placement of smaller sized openings in areas e and f between traces 125 proves enhanced adhesion within the base substrate 156 while maintaining sufficient shielding of EMI generated by traces 125. This concept is illustratively shown in FIG. 5.

FIG. 4 shows an exemplary layout of a portion of an IC device 500 according to an embodiment of the present invention. In particular, FIG. 5 shows an IC device layout 500 with a shield region 402 formed in an electronic substrate. The EMI shield region includes at least a first enhanced adhesion area 406 having openings 420. In FIG. 5, the first adhesion area 406 is bounded by EMI reactive electrical traces 410, 412, and 414. In enhanced adhesion area 406, the spacing between these adjacent traces 410, 412, and 414 is insufficient to allow placement of a large size opening, such as opening 416. However, the spacing is sufficient to allow placement of one or more openings of a smaller size 420. Accordingly, in these smaller enhanced adhesion areas, smaller sized openings 420 can be used. In some embodiments, in addition to utilizing smaller sized openings 420, the design rule spacing utilized can also be decreased, as the processing margin for forming such smaller openings 420 is typically larger.

As described above, the openings in the EMI shield region can vary in size. Accordingly, one of ordinary skill in the art will recognize that the electrical traces 410, 412, and 414 need not have openings of the same size on both sides. Rather the selection of opening size in a particular portion of the shield region 402 is determined based on its area and geometry. For example, as shown in FIG. 5, other openings 421 surrounding the traces 410 and 412 include openings of a larger size 420.

Figure 6:
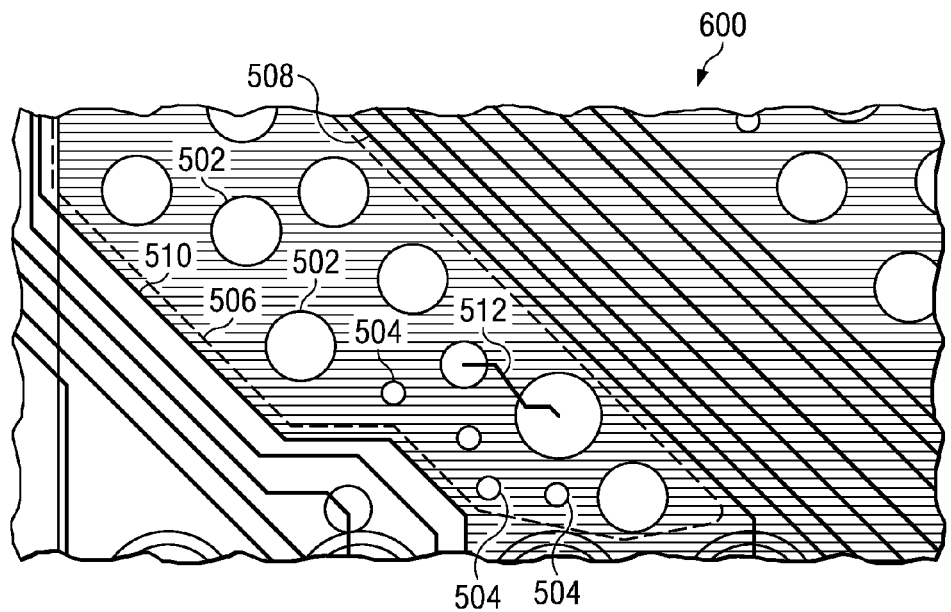
FIG. 6 shows an exemplary layout of a portion of an IC device according to an embodiment of the present invention.

In addition to using openings of different sizes in different enhanced adhesion areas, in some embodiments, a mix of differently sized openings can be used in a single enhanced adhesion area. FIG. 6 shows an exemplary layout of a portion of an IC device 600 according to an embodiment of the present invention. In IC layout 500, openings of both a larger size 502 and a smaller size 504 are used in enhanced adhesion area 506. In enhanced adhesion area 506, the portion bounded only by traces 508 and 510 allow placement of openings of a larger size 502. However, in areas of portion 508 also bounded by traces 510 and 512, the remaining spacing is insufficient for such larger openings 502. In such areas, openings of a smaller size 504 are used instead. In some cases, no openings can be inserted. For example, in the portion of enhanced adhesion area 506 bounded by traces 512 and 508, insufficient spacing is provided for insertion of an opening of any available size. In such cases, the portion would remain solid.

Figure 7:
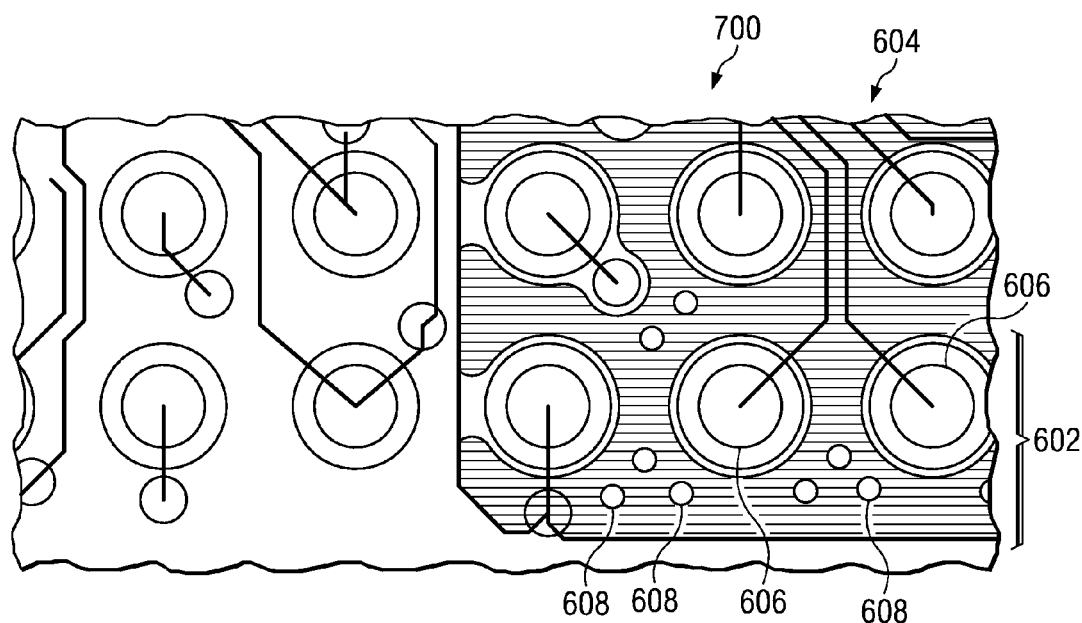
FIG. 7 shows an exemplary layout of a portion of an IC device according to an embodiment of the present invention.

In some embodiments of the present invention, additional openings can also be included in the EMI shield region to improve adhesion along an edge of the EMI shield region or along portions of the EMI shield region in proximity with an edge of the functional die being mechanically attached. This can result in improved resistance against delamination along such edges. FIG. 7 shows an exemplary layout of a portion of an IC device 700 according to an embodiment of the present invention. In particular, FIG. 7 shows an IC device 700 where a portion 602 of an EMI shield 604 that is to be in proximity with an edge of a functional die to be attached is shown. In this portion 602, large size openings 606 can be provided for electrical coupling of the electronic substrate to a die. Typically, the size of such openings is sufficiently large to expose a sufficiently large surface area of the electronic substrate and ensure proper adhesion. However, because stress is typically enhanced in such regions, in embodiments of the present invention, additional openings of a smaller size 608 can be placed along the edges of the EMI shield region 604 to increase the area and thus the amount of the adhesion.

Figure 8:
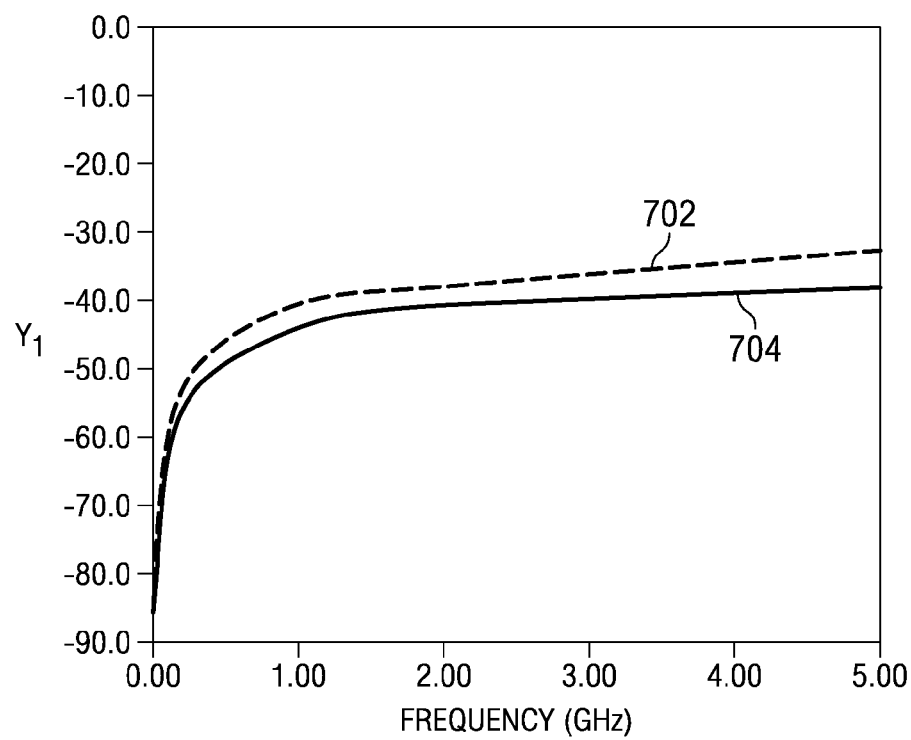
FIG. 8 shows an exemplary graph comparing electromagnetic coupling as a function of frequency for a pair of shielded electrical traces in integrated circuit devices with a conventional EMI shield and EMI shields, according to an embodiment of the present invention.

As described above, EMI shield layouts with aperiodic opening arrangements can generally be used to block EMI while promoting adhesion within the base electronic substrate. FIG. 8 shows the admittance ratio ($y_1$) for a pair of EMI sensitive traces in the stacked integrated circuit device as a function of frequency, wherein the IC device includes a digital radio IC and a digital memory and processor IC configured in a stacked arrangement. For EMI sensitive circuits, the result of EMI interference is typically an increase in coupling between circuit elements, resulting in a decrease of the admittance ratio $y_1$ due to the increase of EMI-induced impedance. As shown in FIG. 8, over the frequency range of 0 to 5 GHz, the admittance ratio values 702 for an IC device having a conventional periodic cross-hatched EMI shield region is shown to be approximately 4-6 dB lower (demonstrating increased coupling) as compared admittance ratio values 704 for an IC device having an EMI shield region according to the various embodiments of the present invention.

Figure 9:
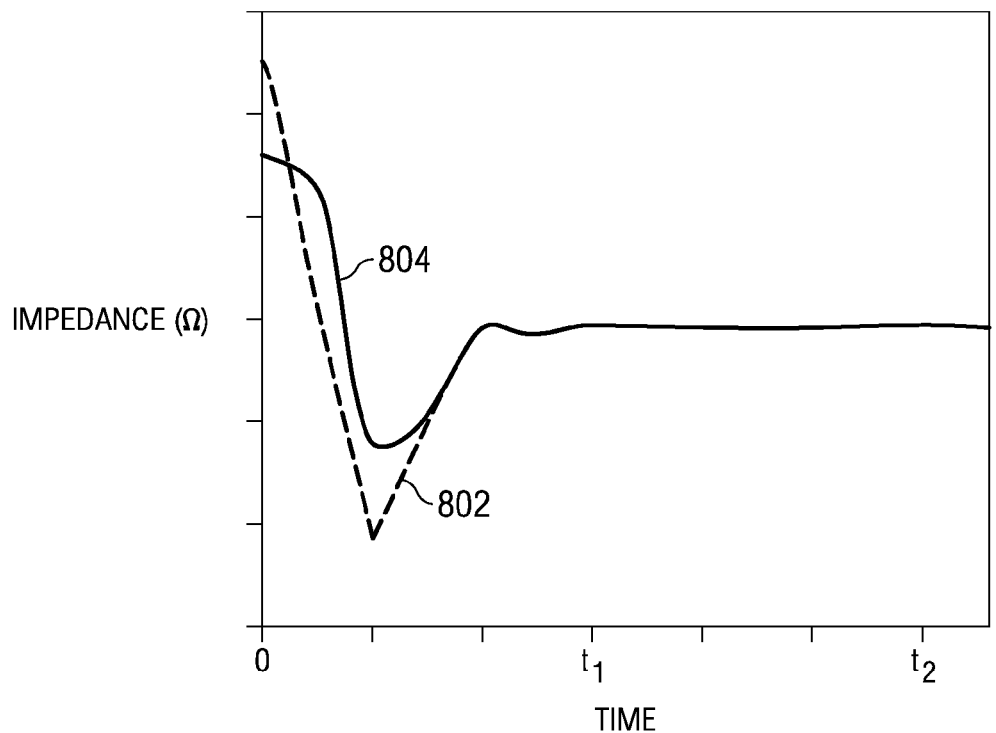
FIG. 9 shows an exemplary graph comparing input impedance as a function of time for a shielded electrical trace in integrated circuit devices with a conventional EMI shield and EMI shields, according to an embodiment of the present invention.

As described above, EMI directly impacts the impedance of EMI sensitive traces. In particular, the characteristic impedance or surge impedance can also be affected by EMI, and can result in poor impedance control during operation of an IC in an IC comprising device. FIG. 9 shows an exemplary graph comparing input impedance as a function of time for a shielded electrical trace in IC devices with a conventional EMI shield and EMI shields according to an embodiment of the present invention. In particular, FIG. 9 shows the characteristic impedance of an EMI sensitive electrical trace in an integrated circuit device including a digital radio integrated circuit and a digital memory and processor integrated circuit configured in a stacked arrangement. FIG. 9 shows impedance of the electrical trace as function of time. As shown in FIG. 9, over time period between 0 and $t_1$ ($\leq 1$ ns) the impedance of the electrical trace varies regardless of the EMI shield region design being used. Over the time period between $t_1$ and $t_2$ and beyond ($\geq 1$ ns), the impedance reaches a steady state value that is approximately equal regardless of the EMI shield region deign being used. However, as shown in FIG. 9, the magnitude of variation in impedance values 802 for an IC device having a conventional periodic cross-hatched EMI shield region is shown to be greater as compared the magnitude of variation in impedance values 804 for an IC device having an EMI shield region according to an embodiment of the present invention. Accordingly, including an EMI shield region according to the various embodiments of the present invention improves impedance control. Such control can be critical especially when the frequency at which signals are being applied to the EMI sensitive traces is high, since the resulting characteristic impedance will generally be a function of the amount of such switching.

Figure 10:
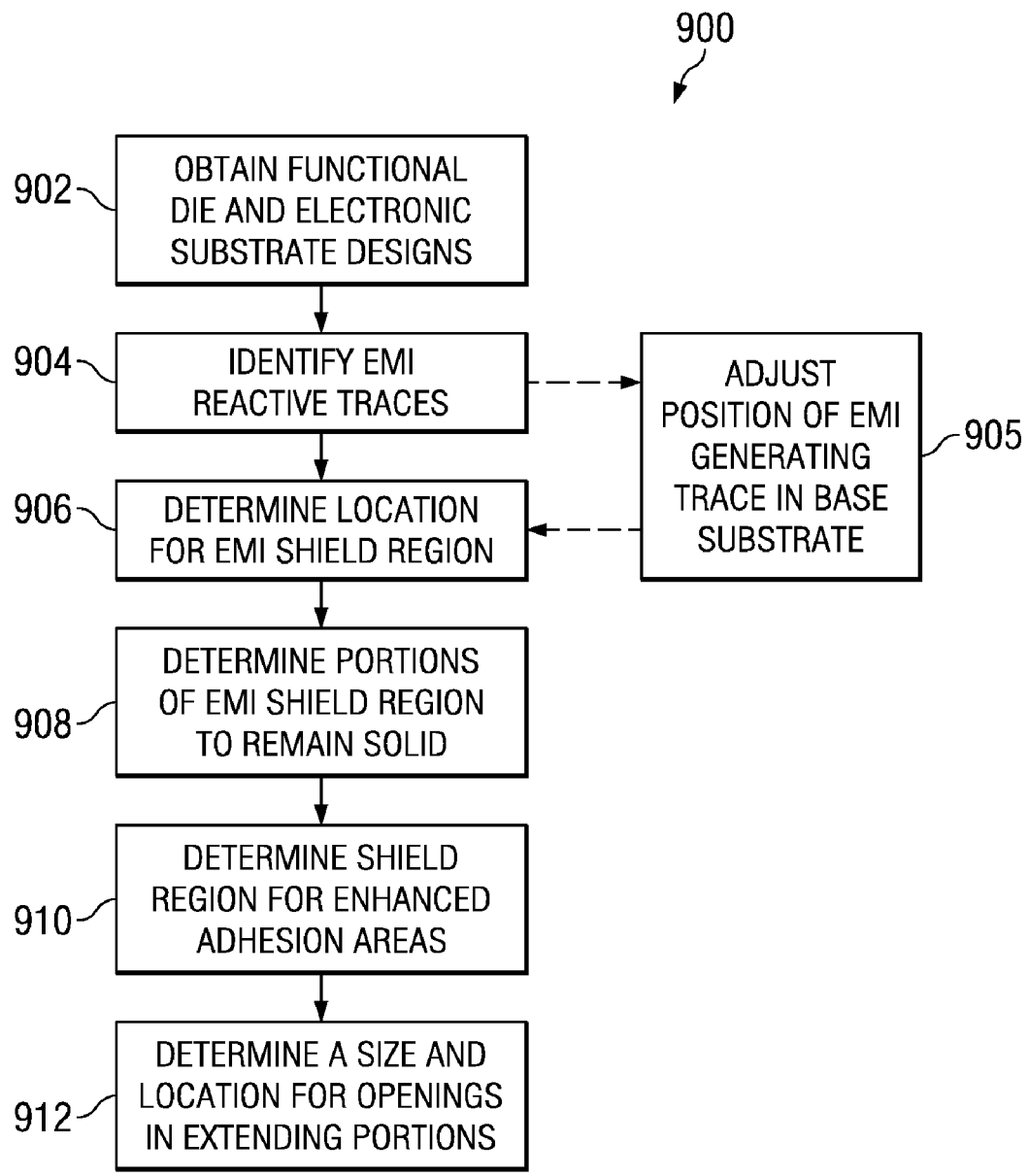
FIG. 10 shows steps in an exemplary method for designing an IC device including EMI shields in accordance with an embodiment of the present invention.

In embodiments of the present invention using aperiodic openings, a design for the EMI shield region can be generated in various ways. FIG. 10 shows steps in an exemplary method 900 for designing an IC device including EMI shields in accordance with an embodiment of the present invention. Method 900 can be implemented manually by a circuit designer or can be implemented automatically in a design tool including automatic layout and error checking capabilities.

First, in step 902 the design of the electronic substrate(s) can be obtained, as well as the designs for any functional die normally included with the electronic substrate design. For example, as previously described, the base electronic substrate can be provided to an RF device manufacturer including a controller IC. Therefore, in step 902, the locations of the EMI passive portions and EMI generating portions can be provided, along with the locations of electrical traces connecting the two interfaces. Once the design is obtained in step 902, one or more traces in the base substrate that will carry EMI susceptible (e.g. analog) signals can be identified in step 904. This identification can be based on the types of circuits the base substrate is designed to operate with or based on empirical data available for the particular IC devices. After these traces are identified in step 904, the location for the EMI shield region can be determined in step 906. That is, an appropriate location within the electronic substrate for the EMI shield region can be selected based on the location of the traces identified in step 904. In some embodiments, the position of the EMI generating traces in the base substrate can be adjusted in step 905 prior to determining a final location for the EMI shield region in step 906. For example, the EMI generating traces can be bundled along a common path area 126 as described above with respect to FIG. 3B. This can allow the size of the shield region to be reduced, improving adhesion in the base substrate.

Once the location for the shield region(s) is selected in step 906, the EMI shield region can be defined. Initially, in step 908, the solid areas for the EMI shield region can be determined based on the locations of the traces identified in step 904. The placement of solid areas can be also adjusted as needed to accommodate the presence of other circuits in the base electronic substrate. For example, the design can be adjusted to prevent shorting of circuit elements to the EMI shield region.

Step 910 comprises identifying extending portions in the EMI shield region for use as enhanced adhesion areas. In step 912, the location and size of openings in the identified enhanced adhesion areas can be determined. The location and size of the openings can be determined in several ways. For example, in some embodiments a first enhanced adhesion area and a first size of opening can be selected. Based on the design rules, a maximum number of openings of the first size can be placed in selected enhanced adhesion area. In other embodiments, a second size can then be selected and a maximum number of openings of the second size can be placed in the remaining portions of the selected enhanced adhesion area. This can be repeated for other sizes of openings. The method can then be repeated for other enhanced adhesion areas. In still other embodiments, as previously described, once other openings are placed, the regions in proximity to the edge of the EMI shield region or the edge of the functional circuit die to be attached to the electronic substrate can be selected and additional openings can be inserted to enhance adhesion.

These are but a few examples. Accordingly, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. For example, in embodiments of the invention including a transceiver, an antenna coupled to the transceiver may be formed on the same electronic substrate. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of forming a package-on-package (POP) comprising integrated circuit (IC), comprising:
   providing POP package encapsulated precursor having encapsulation material, comprising an electronic substrate comprising a plurality of electrically conductive layers separated by a plurality of dielectric layers, said electronic substrate providing a top surface;
   a first portion of said top surface having an IC die attached thereto having;
   a second portion of said top surface having a plurality of first attach pads positioned on opposing sides of said IC die having exposed electrically conductive surfaces for electrically coupling to at least a first electronic device on top of said IC die, and
   at least a third portion of said top surface positioned laterally with respect to said first and said second portion of said top surface, said third portion including a plurality of second attach pads having exposed electrically conductive surfaces exposed through the encapsulation material for electrically coupling to at least a second electronic device, wherein at least one of said plurality of electrically conductive layers comprises a coupling trace that electrically couples at least one of said plurality of second attach pads to at least one of said IC die and at least one of said plurality of first attach pads, and wherein a first and second of said plurality of electrically conductive layers are arranged to provide a coaxial shield region for at least a portion of a length of said coupling trace;
   coupling said first electronic device to said plurality of first attach pads and positioned on top of said IC die; and
   coupling at least a second electronic device electrically to said plurality of second attach pads.

2. The method of claim 1, wherein said first electronic device comprises a memory module, and said second electronic device comprises an RF circuit.

* * * * *